(12) United States Patent
Fletcher

(10) Patent No.: US 6,242,958 B1
(45) Date of Patent: Jun. 5, 2001

(54) MASTER SLAVE FLIP FLOP AS A DYNAMIC LATCH

(75) Inventor: Thomas Fletcher, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/473,975

(22) Filed: Dec. 29, 1999

(51) Int. Cl.[7] .................................................. H03K 3/289
(52) U.S. Cl. ................................................ 327/202; 327/201
(58) Field of Search .................................... 327/202, 203, 327/200, 201, 212

(56) References Cited

U.S. PATENT DOCUMENTS 4,469,962 * 9/1984 Snyder ................................. 327/203
5,784,384 * 7/1998 Maeno ................................. 714/726
6,097,230 * 8/2000 Bareither ............................. 327/202

* cited by examiner

Primary Examiner—Toan Tran
(74) Attorney, Agent, or Firm—Kenyon & Kenyon

(57) ABSTRACT

A flip-flop circuit comprising a dynamic master coupled to a clock, the clock being characterized by an active stated of a limited duration, and a static latch coupled to the clock and coupled to the dynamic master. In an embodiment, the limited duration is less than the minimum time period in which the master can change from a first state to a second state.

29 Claims, 5 Drawing Sheets

MASTER SLAVE FLIP FLOP AS A DYNAMIC LATCH

FIELD OF THE INVENTION

Embodiments of the present invention provide a flip-flop circuit. In particular, the present invention provides a master-slave flip-flop having a dynamic master and a static slave.

BACKGROUND OF THE INVENTION

Important characteristics of an integrated circuit are the amount of power it consumes, the amount of area it takes up, and the speed of the circuit. In most cases, it is advantageous for a circuit to minimize power consumption and area and to maximize speed. One approach used to save power in an integrated circuit is temporarily stopping the clock in part of the circuit that is not operating. A clock is stopped when it remains in a state (e.g., active or inactive) for an extended period of time. A clock may be considered to be in the active state when it is at a high voltage. Typically, only ten percent of an integrated circuit is operating at any one time, and it is advantageous to stop the clock to the other ninety percent of the circuit if possible. Temporarily stopping the clock to a part of the circuit reduces power consumption, without degrading the accuracy of the integrated circuit, because circuit elements will not use as much power when the clock for that part of the circuit is stopped.

Flip-flops are basic building blocks of sequential logic circuits, and modern microprocessors contain thousands of flip-flops. A flip-flop typically comprises a master component, which latches data input when the clock is in a first state, and a slave component, which latches data from the master when the clock is in a second state. FIG. 1 shows a prior flip-flop 100 which has a master latch 101 and a slave latch 102. Clock 121 cycles between an active (high) state and an inactive (low) state. Master 101 is a static latch because it holds data for an indefinite period of time after clock 121 is stopped. In particular, master latch 101 has a keeper 110 that maintains its state when the clock 121 is stopped. Persons of ordinary skill in the art will appreciate that keeper 110 maintains its state, regardless of any change in the state of clock 121, until new data is input through data line 130. Slave latch 102 is also a static latch and has a keeper 120.

One concern with stopping the clock in an integrated circuit is that the circuit could lose data, which would generally be unacceptable. For example, if master latch 101 of flip-flop 100 where to change its state when clock 121 is stopped in the active state, this new state (i.e., new data) would be imparted to slave latch 102, which takes on the state of the master latch when the clock is in the active state. For this reason, prior art systems that allow the clock to stop use static latches to prevent the state of the latches from drifting during the time that the clock is stopped. Master latch 101 will not change its state until the clock 121 becomes inactive because keeper 101 maintains its state indefinitely when clock 121 is stopped in the active state. Thus, the data in master latch 101 will not be lost. However, the inclusion of keeper 110 and keeper 120 in prior art flip-flop 100 increases the area and power consumption of the flip-flop and decreases the speed of the circuit. The removal of keeper 110, for example, results in an approximately ten percent decrease in the power consumed, ten percent reduction in area, and ten percent reduction in the circuit delay. This savings is significant because modern microprocessors contain such a large number of flip-flops.

Based on the foregoing, there is a need for a flip-flop which has a reduced number of gates but which allows the clock to be stopped without data loss.

SUMMARY OF THE INVENTION

Embodiments of the present invention provide a flip-flop circuit. The flip-flop circuit comprises a dynamic master coupled to a clock, and a static slave coupled to the clock and coupled to the dynamic master. The clock is characterized by a first state of a maximum duration.

DETAILED DESCRIPTION

Figure 1:
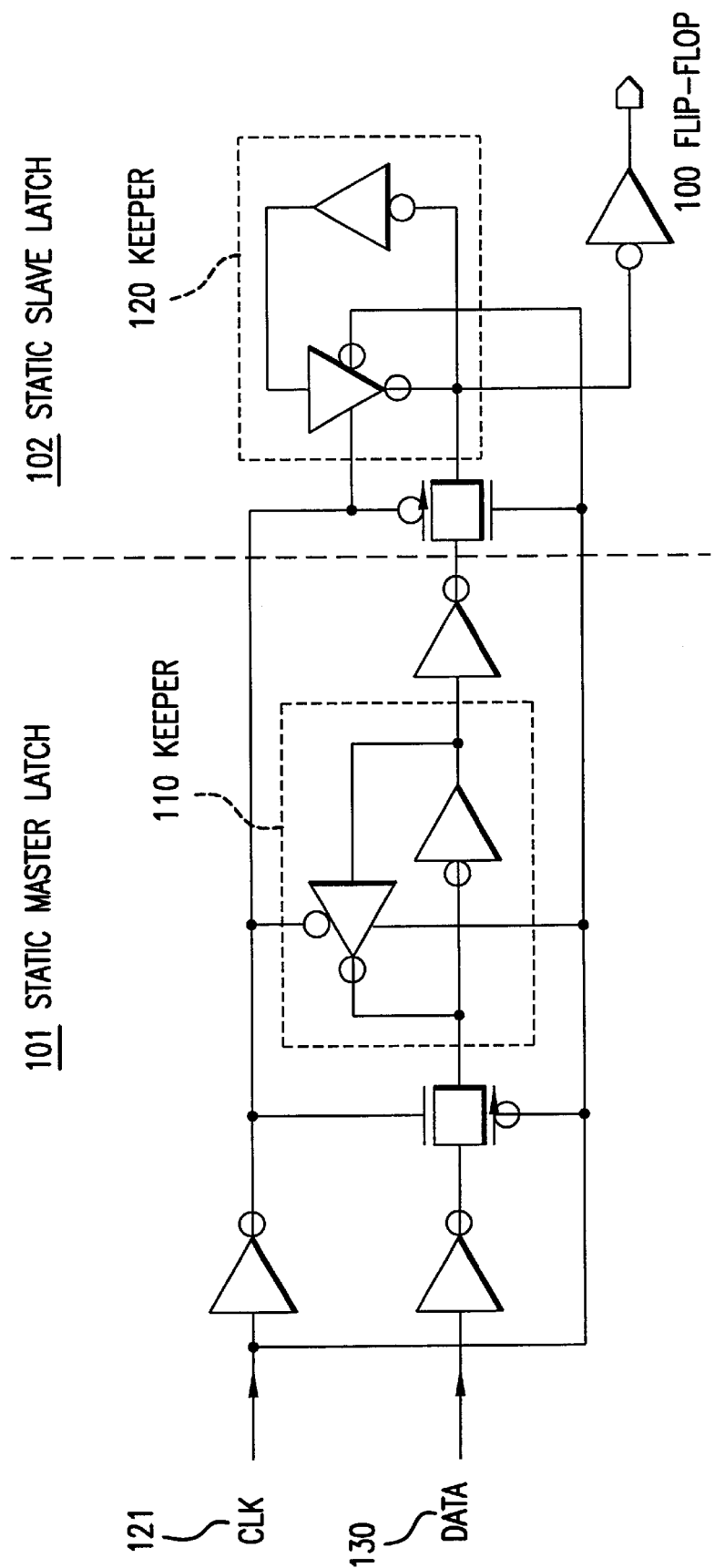
FIG. 1 is block diagram of a prior art master-slave flip-flop.
Figure 2:
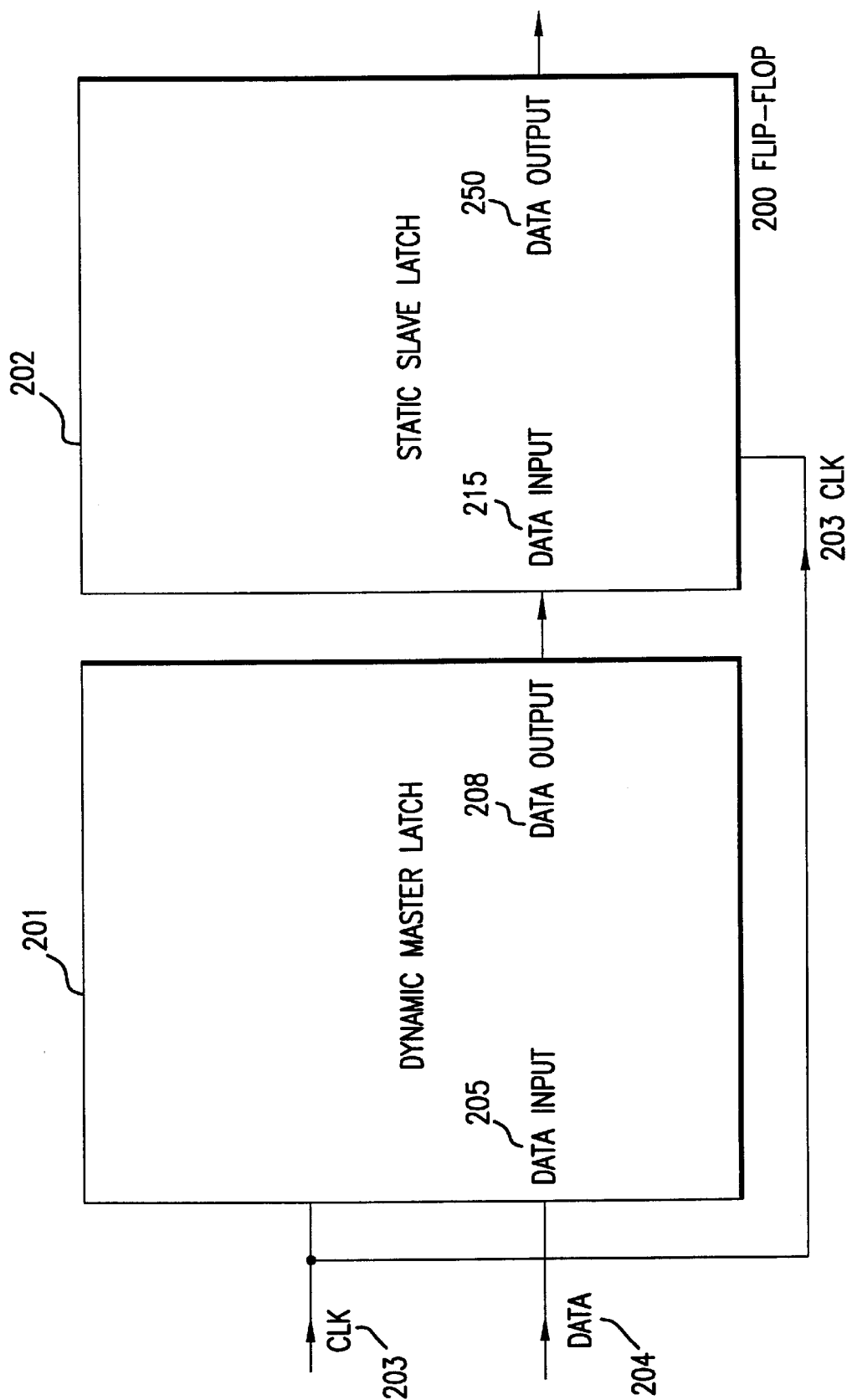
FIG. 2 is a block diagram of a flip-flop in accordance with one embodiment of the present invention.

FIG. 2 is a block diagram of a flip-flop 200 in accordance with one embodiment of the present invention. FIG. 2 shows master component, which in this embodiment is master latch 201, coupled to slave component, which in this embodiment is slave latch 202. Data output 208 of master latch 201 may be coupled to data input 215 of slave latch 202. The term "coupled" is intended to encompass and be broader than the term "directly connected." If A is directly connected to B, and B is directly connected to C, then A is said to be "coupled" to C. In other words, the term coupled includes the term "indirectly connected." FIG. 2 shows clock 203 coupled to master latch 201 and slave latch 202. In this embodiment, data line 204 is coupled to data input 205 of master latch 201, and slave latch 202 has a data output 250.

Clock 203 varies between a first state and a second state. In one embodiment, the first state is an active (high) state and the second state is an inactive (low) state. When clock 203 is in the active state, in this embodiment: (1) master latch 201 is isolated from the input data; and (2) input data is transferred from master latch 201 to slave latch 202. When clock 203 is in the inactive state, in this embodiment: (1) input data is transferred to master latch 201; and (2) slave latch 202 is isolated from master latch 201. In another embodiment, for example where a negative-going clock is used, master latch 201 may be open to input when the clock is active and slave latch 202 may be open to input when the clock is inactive.

In this embodiment, clock 203 is characterized by an active state of a maximum duration. Clock 203 may be a pulsed clock. In one embodiment of a pulsed clock, the rising and falling edges of the clock are generated from the same edge of the reference clock, and the pulse width of the pulsed clock is not a function of the pulse width or frequency of the reference clock. In a further embodiment of a pulsed clock, the clock may be stopped, but may only be stopped in the inactive state.

Slave latch 202 is a static latch and, in the absence of new input data, will maintain data indefinitely even if clock 203 is stopped in either state. Master latch 201 is a dynamic latch and does not have a keeper to maintain data indefinitely after clock 203 is stopped. Because master latch 201 is a dynamic latch, sub-threshold leakage current may cause its state to eventually drift in the absence of a driving voltage. However, any drift in master latch 201 will not occur immediately after it is isolated from a driving voltage. Rather, in this embodiment master latch 201 will maintain its state (i.e., its data) for some period of time after clock 203 becomes inactive because of the capacitance inherent in components in master latch 201. Persons of ordinary skill in the art will appreciate that the components typically used in an integrated circuit have some inherent capacitance. In one embodiment, master latch 201 will maintain its data without drifting for at least two nanoseconds. In another embodiment, master latch 201 will maintain its data do without drifting for at least 100 nanoseconds.

To ensure that flip-flop 200 does not lose the data in master latch 201, the maximum active duration of clock 203 should be less than the minimum time it takes for master latch 201 to drift to the opposite state in the absence of a driving voltage. In one embodiment, the active duration of the clock is one nanosecond. When clock 203 changes to the inactive state, the state of slave latch 202 becomes isolated from the data at input 215, and the data on line 204 will be transferred to master latch 201. As long as clock 203 changes from the active state to the inactive state before master latch 201 can drift to a new state, flip-flop 200 will not lose the data in master latch 201.

Figure 3:
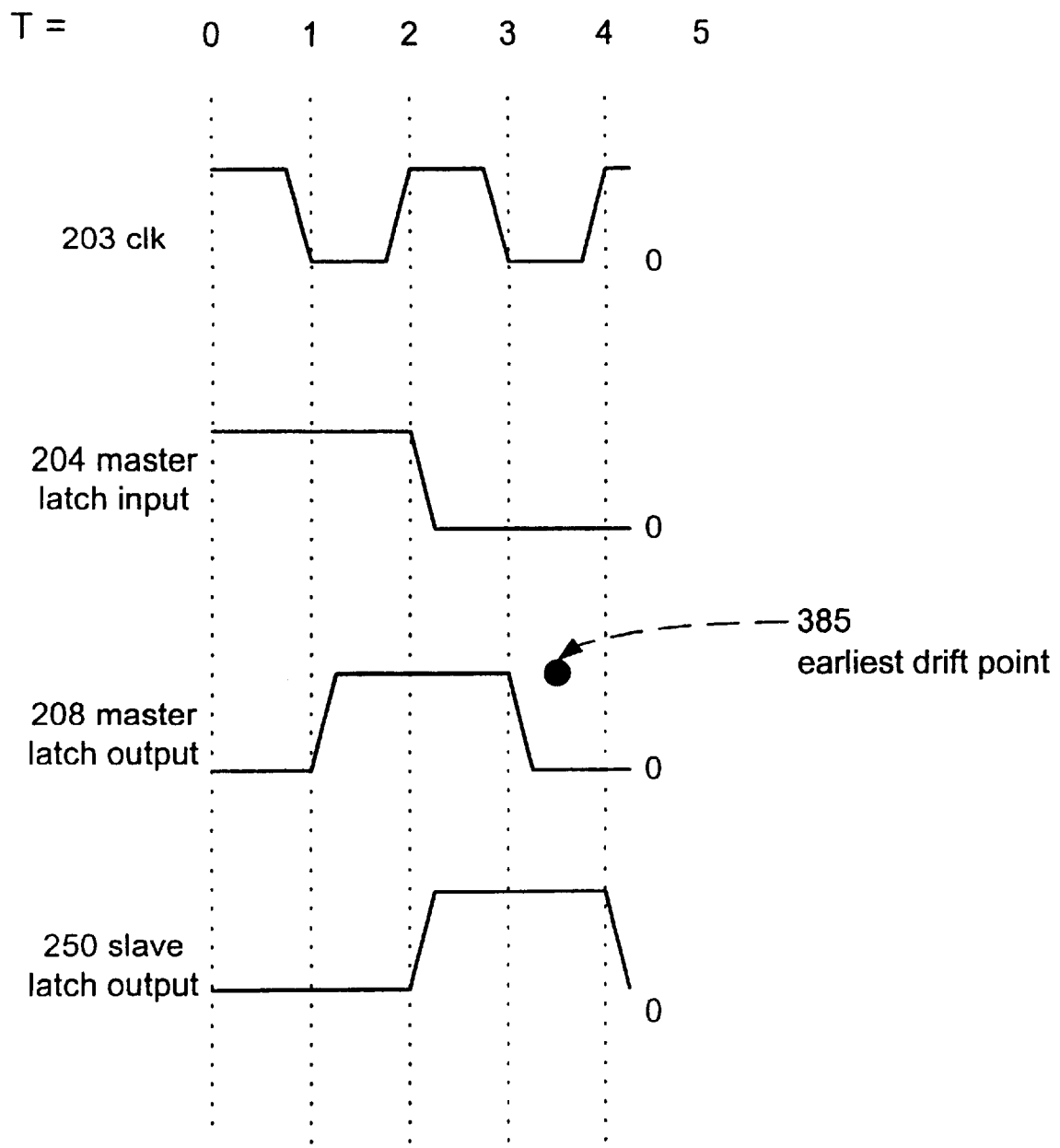
FIG. 3 is a timing diagram for a flip-flop in accordance with one embodiment of the present invention.

FIG. 3 is a timing diagram illustrating a sample of the operation of a flop-flop according to one embodiment of the present invention. FIG. 3 shows the state of a clock 203, a master latch data input line 204, a master latch data output 208, and a slave latch data output 250 during a series of clock cycles. With reference to FIG. 2, input line 204 may be a data input to master latch 201, clock 203 may be input to master latch 201 and slave latch 202, master latch data output 208 may be an output of master latch 201, and slave latch data output 250 may be an output of slave latch 202. The data at output 208 indicates the state of master latch 201, and the data at output 250 indicates the state of slave latch 202.

At time T=0, FIG. 3 shows that clock 203 is in the active (or high) state and that master latch data input 204 is high (which can be represented as logical 1). FIG. 3 also shows that the output of master latch 208 is low (i.e., that master latch 201 contains a zero) and the output of slave latch 250 is low (i.e., that slave latch 202 contains a zero). Even though master latch data input 204 has a value of 1, master latch output 208 maintains a value of 0 at T=0 because, in this embodiment, master latch 201 is isolated from data input line 204 when clock 203 is active. According to this embodiment, slave latch output 250 maintains a value of 0 because a 0 is being transferred to slave latch 202 from master latch 201.

At T=1, FIG. 3 shows clock 203 changing to the inactive (low) state. Master latch input 204 is shown remaining at 1. Master latch output 208 is shown changing to a value of 1 because, in this embodiment, the input data is transferred to master latch 201 when clock 203 is in the inactive state. Slave latch output 250 is shown maintaining a value of 0 because, in this embodiment, slave latch 202 is isolated from master latch 201 when clock 203 is inactive.

At T=2, FIG. 3 shows clock 203 becoming active and data input line 204 changing to a value of 0. Master latch output 208 maintains a value of 1 because, in this embodiment, master latch 201 is isolated from data input line 204 when clock 203 is active. FIG. 3 shows the value at slave latch output 250 becoming 1 because, when clock 203 is in the active state, the data in master latch 201 is transferred to slave latch 202. Because master latch 201 is a dynamic latch, master latch 201 may eventually drift to a new state when not driven by an input voltage. In the case shown in FIG. 2, master latch 201 is not driven by an input voltage during the period from T=2 to T=3. Even though it is a dynamic latch, master latch 201 maintains a value of 1 starting at T=2, and continuing for some period of time, because of inherent capacitance of components in master latch 201. To prevent a loss of data by master latch 201, clock 203 is characterized by an active state having a maximum duration smaller than the minimum time it takes for master latch 201 to drift to a new state after being isolated from a driving voltage. In FIG. 2, the first point at which master latch 201 may drift to a new state after the clock becomes active at T=2 is designated point 385 and lies between T=3 and T=4. In other embodiments, point 385 may be located at any place after T=3. Because in this embodiment master latch 201 maintains a value of 1 from T=2 to T=3, the value of master latch 201 is transferred to slave latch 202 and slave latch output 208 maintains a value of 1.

At T=3, FIG. 3 shows clock 203 becoming inactive and data input line 204 having a value of 0. Master latch output 208 is shown changing to a value of 0 because, in this embodiment, the value of data line 204 is transferred to master latch 201 when clock 203 is inactive. Master latch 201 has not had a chance to drift to a new state at T=3 because, in this embodiment, the maximum active duration of clock 203 is less than the minimum time it takes for master latch 201 to drift to a new state after being isolated from a driving voltage. Master latch 201 will not drift to a new state at point 385 because, but this time, clock 203 is inactive and master latch 203 is thus being driven by data input 204. At T=3, slave latch output 250 maintains a value of 1 because, in this embodiment, slave latch 202 is isolated from master latch 201 when clock 203 is inactive.

At T=4, FIG. 3 shows clock 203 becoming active and master latch data input 204 maintaining a value of 0. Master latch output 208 maintains a value of 0 because, in this embodiment, master latch 201 is isolated from data input 204 when clock 203 is active. Slave latch output 250 changes to a value of 0 because, in this embodiment, the value of master latch 201 is transferred to slave latch 202 when clock 203 is active.

Each time that clock 203 becomes inactive and a value of 1 is transferred to master latch 201, the state of master latch 201 resets at that value. Due to master latch 201's inherent capacitance and the limited duration of the active state of clock 203, master latch 201 maintains a value of 1 while clock 203 becomes inactive and holds that value at least until clock 203 changes back into the active state. Similarly, each time that clock 203 becomes inactive and a value of 0 is transferred to master latch 201, the state of master latch 201 resets at that value and, due to its inherent capacitance and the duration of the active state of clock 203, master latch 201 maintains a value of 0 while clock 203 becomes active and holds that value at least until clock 203 changes back into the inactive state. Thus, flip-flop 200 will not suffer from data loss even though master latch 201 does not have a keeper.

Figure 4:
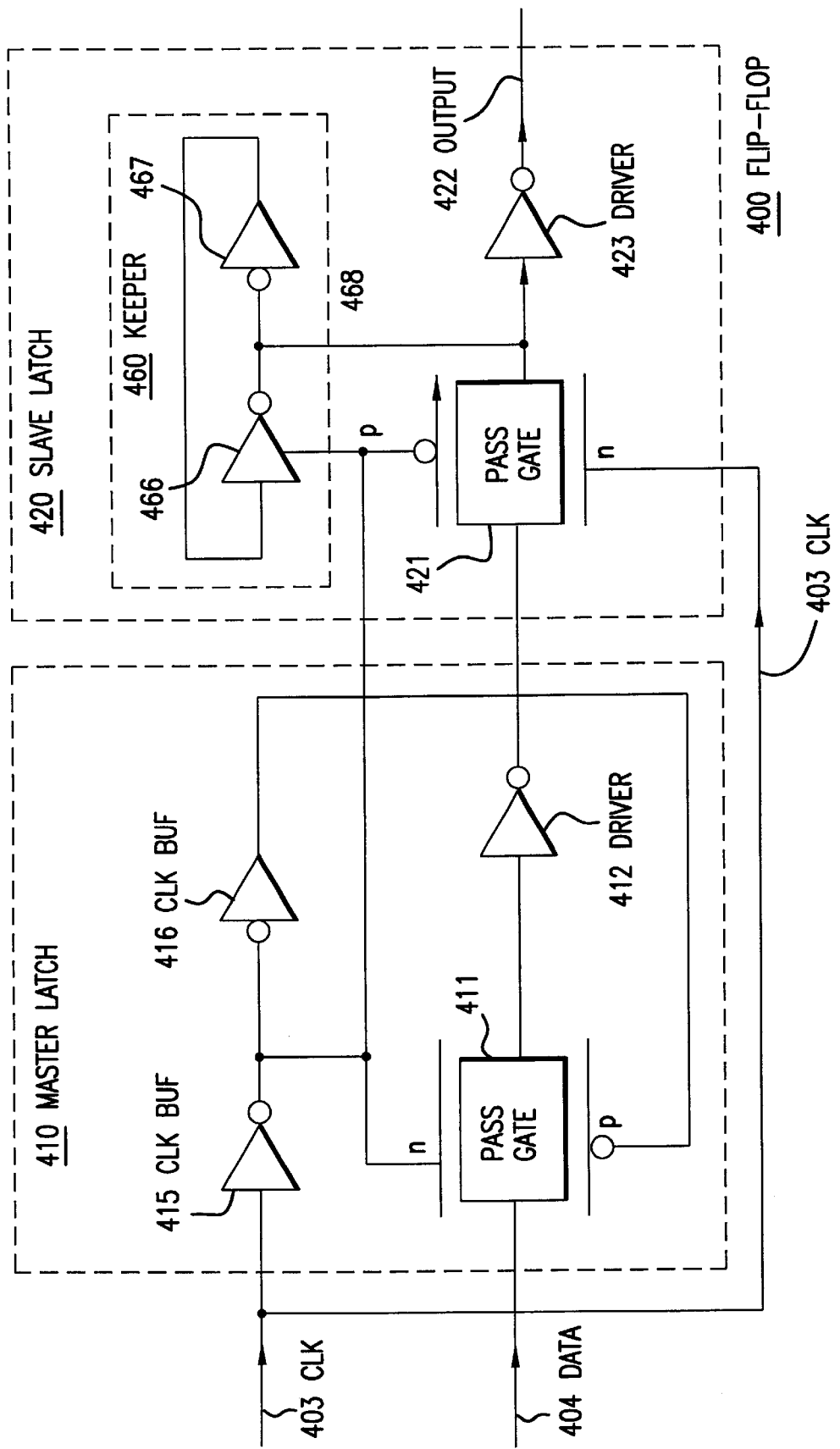
FIG. 4 is a more detailed block diagram of a flip-flop in accordance with one embodiment of the present invention.

FIG. 4 is a more detailed block diagram of a flip-flop in accordance with one embodiment of the present invention. As shown in FIG. 4, flip-flop 400 may contain a master latch 410 coupled to a slave latch 420, with clock 403 input to master latch 410 and slave latch 420. Master latch 410 may contain a pass gate 411, driver 412, and clock buffers 415 and 416. Pass gate 411 may be a complimentary pass gate. Clock buffers 415 and 416 and driver 412 may be CMOS inverters. According to this embodiment, pass gate 411 passes the data from its data input to its data output when the line connected to its n terminal is active and its p terminal is inactive. As shown in FIG. 4, clock 403 may be coupled to clock buffer 415, which may be coupled to clock buffer 416 and to the n terminal of pass gate 411. The output of clock buffer 416 may be coupled to the p terminal of pass gate 411. Data line 404 may be coupled to the data input of pass gate 411, and the data output of pass gate 411 may be coupled to driver 412. Driver 412 may be coupled to slave latch 420.

As further shown in FIG. 4, slave 460 may contain a pass gate 421, a keeper 460 and a driver 423. In one embodiment, pass gate 421 is a complimentary pass gate, wherein the output of clock buffer 415 is coupled to the p terminal of pass gate 421 and clock 403 coupled to the n terminal of pass gate 421. As shown in FIG. 4, the output of driver 412 may be coupled to the data input of pass gate 421, the data output of pass gate 421 may be coupled to driver 423, and driver 423 may be coupled to output line 422. Driver 423 may be an inverter gate. Keeper 460 may be a standard keeper. Keeper 460 may be coupled to pass gate 420 and driver 423 through line 468. In one embodiment, keeper 425 comprises half jam latch 466 and inverter 467, with the output of half jam latch 466 coupled to inverter 467, the output of inverter 467 coupled to half jam latch 466, and the output of clock buffer 415 coupled to half jam latch 466. Keeper 460 maintains the output of flip-flop 400 constant in the absence of a driving voltage from master 410.

In this embodiment, the clock to the n terminal of pass gate 411 is inverted once by clock buffer 415, and the clock to the p gate of pass gate 411 is inverted twice (by clock buffer 415 and clock buffer 416). The clock 203 is coupled to the n terminal of pass gate 421 without being inverted, and the clock to the p gate of pass gate 421 is inverted once (by clock buffer 415). Thus, the clock of the slave latch 420 is the inverted clock of the master latch 410. When the clock is in the inactive state, master latch 410 is open to input and slave latch 420 is closed, and when the clock is in the active state, master latch 410 is closed to input and slave latch 420 is open. By inverting the clock twice before inputting it to the p terminal of the master pass gate 411, the master pass gate 411 opens slightly later than the slave pass gate 421 closes. This prevents the flip-flop 400 from being transparent, even momentarily. In another embodiment, for example if clock buffer 415 were removed, master latch 410 is open to input when the clock is active and slave latch 420 is open to input when the clock is inactive.

According to this embodiment, when clock 403 is inactive, data may be transferred from data line 404 though master pass gate 411 to driver 412. For example, a value of 1 may be transferred from data line 404 to driver 412. The data may not be transferred to slave latch 420, however, because pass gate 421 will be closed and slave latch 420 will be isolated from the data in driver 412. Keeper 460 maintains the data it possessed before clock 403 became inactive. For example, keeper 460 may maintain a value of 0. The data in keeper 460 may be transferred through driver 423 to output 422. In the example above, line 422 will output a 0 value for flip-flop 400.

When clock 403 changes to the active state, in this embodiment pass gate 411 closes and driver 412 becomes isolated from a driving voltage. Because driver 412 has inherent capacitance, for a period of time it maintains the state (i.e., data value) it exhibited before pass gate 411 closed. For example, if the value of 1 was transferred to driver 412 while clock 403 was inactive, when clock 403 becomes active driver 412 maintains a value of one for a finite period of time. In this embodiment, pass gate 421 opens when clock 403 becomes active and the value at driver 412 is transferred through pass gate 421 to driver 423 and to keeper 460. In this embodiment, when pass gate 421 passes a value different than the value being stored in keeper 460 (i.e., the value on line 468), the value in the pass gate is forced into keeper 460. Because in this embodiment the active duration of clock 403 is less than the time it takes for driver 412 to drift to another value, driver 412 maintains a constant value until clock 403 changes to the inactive state. When clock 403 changes to the inactive state, driver 412 may be driven by data line 404 and output line 422 may be driven by keeper 460.

Figure 5:
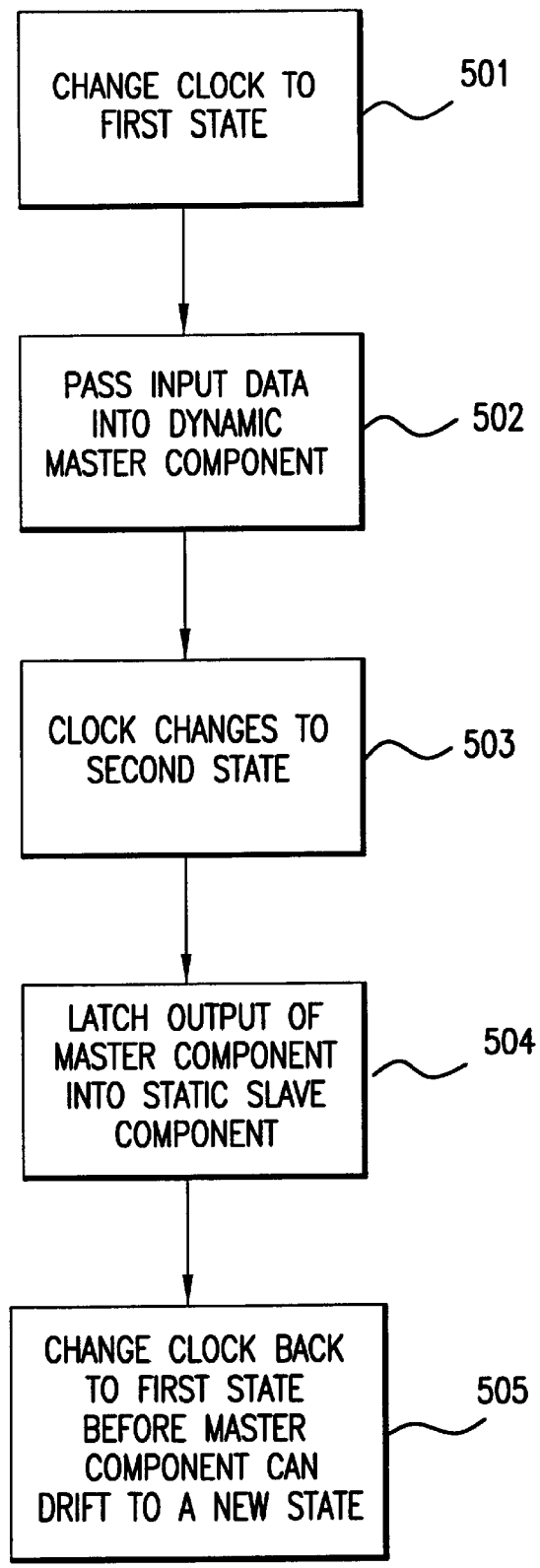
FIG. 5 is a flow diagram of a method of latching data in accordance with one embodiment of the present invention.

FIG. 5 is a flow diagram of a method of latching data in accordance with one embodiment of the present invention. At 501, a clock is changed to a first state. At 502, input data is passed into a dynamic master component. Thus, the dynamic master component will achieve the state dictated by its input. At 503, the clock changes to a second state. At 504, the output of the master component is latched by a static slave component. Due to its inherent capacitance, the dynamic master component maintains the state achieved at 502 for some period of time after the clock changes to a second state (i.e., after 503). At 505, the clock changes back to the first state before the mater component has time to drift to a new state. Once the clock changes back to the first state, the input data is passed into the dynamic master component.

Embodiments of the present invention provide an improved master slave flip-flop that includes a dynamic master. The flip-flop of the present invention can be used in a system that allows the clock to stop. The flip-flop of the present invention includes a reduced number of components because it omits one of the keepers of known flip-flops. Therefore, it reduces power, conserves area, and increases the speed over known flip-flops. Several embodiments of the present invention are specifically illustrated and/or described herein. However, it will be appreciated that modifications and variations of the present invention are covered by the above teachings and within the purview of the appended claims without departing from the spirit and intended scope of the invention. For example, the master may be open when the clock is in an active state, or the master may be open when the clock is in an inactive state. In another example, the flip-flop does not contain driver components or clock buffer components.

What is claimed is:

1. A flip-flop circuit comprising:
   a dynamic master latch coupled to a clock, said master latch comprising a first pass gate, and said clock being characterized by a first state of a maximum duration, wherein said master latch has at least a first state and a second state, and wherein said maximum duration is less than the minimum time period in which said master latch can change from said first state to said second state; and
   a static slave latch coupled to said master latch and said clock, wherein said slave latch comprises a second pass gate coupled to a keeper.

2. The flip-flop circuit of claim 1, wherein said master latch has a data input node, and wherein said master latch assumes the state presented at said data input node when said clock is not in said first state.

3. The flip-flop circuit of claim 1, wherein said clock is a pulsed clock.

4. The flip-flop circuit of claim 1, wherein said dynamic master latch further comprises a driver coupled to said first pass gate and said second pass gate.

5. The flip-flop circuit of claim 4, wherein said dynamic master latch further comprises a first clock buffer and a second clock buffer;

wherein said first clock buffer is coupled to said first pass gate, said second pass gate, second clock buffer, and said keeper; and wherein said second clock buffer is further coupled to said first pass gate.

6. The flip-flop circuit of claim 5, wherein said slave latch further comprises a driver coupled to said keeper and said second pass gate.

7. The flip-flop circuit of claim 6, wherein said keeper comprises a half-jam latch coupled to an inverter.

8. A circuit comprising:

a means for passing an input into a dynamic master component in response to a first state of a clock, the master component having a data output;

a means for latching the data output of the master component into a static slave component in response to a second state of said clock; and a means for controlling said clock to have a second state of a limited duration.

9. The circuit of claim 8, wherein said limited duration is less than the minimum time period in which said master component can change from a first state to a second state.

10. The circuit of claim 8, wherein said clock is a pulsed clock.

11. The circuit of claim 8, wherein said first clock state is the active state.

12. The circuit of claim 8, wherein said first clock state is the inactive state.

13. The circuit of claim 8, wherein said clock is further characterized by a first state of unlimited duration.

14. A flip-flop circuit comprising:

a dynamic master component coupled to a clock, said clock being characterized by a first state of a maximum duration; and a static slave component coupled to said clock and coupled to said dynamic master component, wherein said master component has at least a first state and a second state, and wherein said maximum duration is less than the minimum time period in which said master component can change from said first state to said second state.

15. The flip-flop circuit of claim 14, wherein said clock is a pulsed clock.

16. The flip-flop circuit of claim 14, wherein said maximum duration is 1 nanosecond.

17. The flip-flop circuit of claim 14, wherein said first clock state is the active state.

18. The flip-flop circuit of claim 14, wherein said first clock state is the inactive state.

19. The flip-flop circuit of claim 14, wherein said clock is further characterized by a second state of unlimited duration.

20. A circuit comprising:

a clock generator capable of generating a clock having at least a first state of a limited duration and a second state of unlimited duration;

a dynamic master latch coupled to said clock, wherein said master latch is closed to input data when said dock is in said second state and open to input data when said clock is in said first state, and wherein said dynamic master latch maintains a data state for at least said limited duration after said dock changes from said first state to another state; and a static slave latch coupled to said clock and coupled to said dynamic master latch, wherein said slave latch is closed to input data when said clock is in said second state and open to input data when said clock is in said first state.

21. The circuit of claim 20, wherein said clock is a pulsed clock.

22. The circuit of claim 20, wherein said first state is the active state.

23. The circuit of claim 20, wherein said first state is the inactive state.

24. The circuit of claim 20, wherein the data state maintained represents a data value.

25. A method of latching data, comprising:

passing an input into a dynamic master component in response to a first state of a clock, the master component having a data output;

latching the data output of the master component into a static slave component in response to a second state of said clock; and controlling said clock so that said second state has a limited duration that is less than the minimum time period in which said master component can change from a first state to a second state.

26. The method of claim 25, wherein said clock is a pulsed clock.

27. The method of claim 25, wherein said first clock state is the active state.

28. The method of claim 25, wherein said first clock state is the inactive state.

29. The method of claim 25, wherein said clock is further characterized by a first state of unlimited duration.

* * * * *